United States Patent
Watanabe et al.

(10) Patent No.: US 6,459,044 B2
(45) Date of Patent: Oct. 1, 2002

(54) FLEXIBLE MULTILAYER WIRING BOARD

(75) Inventors: Yasushi Watanabe; Kenichi Shinano, both of Miyagi-ken (JP)

(73) Assignee: Alps Electric Co., Ltd., Tokyo (JP)

( * ) Notice: Subject to any disclaimer, the term of this patent is extended or adjusted under 35 U.S.C. 154(b) by 0 days.

(21) Appl. No.: 09/907,004

(22) Filed: Jul. 16, 2001

(30) Foreign Application Priority Data

Jul. 21, 2000 (JP) ........................................ 2000-226209

(51) Int. Cl.⁷ ................................................. H05K 1/00
(52) U.S. Cl. ........................ 174/254; 174/255; 174/262; 428/209
(58) Field of Search ................................ 174/254, 261, 174/262, 255; 428/209

(56) References Cited

U.S. PATENT DOCUMENTS

| | | | |
|---|---|---|---|
| 4,691,188 A | * 9/1987 | Watanabe et al. ............ | 338/307 |
| 5,448,020 A | * 9/1995 | Pendse ........................ | 174/250 |
| 5,499,444 A | * 3/1996 | Doans, Jr. et al. ............ | 29/830 |
| 5,997,983 A | * 12/1999 | Caron et al. ................. | 428/105 |
| 6,010,769 A | 1/2000 | Sasaoka et al. | |
| 6,162,996 A | * 12/2000 | Schmidt et al. ............. | 174/259 |

* cited by examiner

*Primary Examiner*—Cathy Lam
(74) *Attorney, Agent, or Firm*—Beyer Weaver & Thomas, LLP

(57) ABSTRACT

In a flexible multilayer wiring board, a first conductive pattern provided on a first flexible base material and a second conductive pattern provided on a second flexible base material are made to conduct via a first conductive body filled in a first through hole. Hereby, a flexible multilayer wiring board of which the productivity is satisfactory, which is low-priced and highly reliable in connection can be provided.

7 Claims, 4 Drawing Sheets

FLEXIBLE MULTILAYER WIRING BOARD

BACKGROUND OF THE INVENTION

1. Field of the Invention

The present invention relates to a flexible multilayer wiring board applied to a sheet switch used for a thin-type panel switch of vehicle-mounted or home electric equipment.

2. Description of the Related Art

To explain the configuration of a conventional type flexible multilayer wiring board referring to FIG. 19, the conventional type flexible multilayer wiring board is formed by mainly bonding a first flat flexible base material 110 and a second flat flexible base material 120 via an adhesive 130, a first conductive pattern 111 is provided on the unbonded surface of the first flexible base material 110 and a second conductive pattern 121 is provided on the unbonded surface of the second flexible base material 120.

A through hole 113 is formed in the first flexible base material 110, a through hole 123 is formed in the second flexible base material 120, both the through holes 113 and 123 mutually conduct, gold plate 140 is provided to their inner walls and the first conductive pattern 111 and the second conductive pattern 121 conduct.

The first flexible base material 110 is formed by a flat film substrate made of polyimide, the first conductive pattern 111 made of copper foil is formed on the back surface by etching and gold plate 112 is laminated on the first conductive pattern 111 by electrolytic plating.

The second flexible base material 120 is also similarly formed by a flat film substrate made of polyimide, the second conductive pattern 121 made of copper foil is formed on the surface by etching and gold plate 122 is laminated on the second conductive pattern 121 by electrolytic plating.

The first flexible base material 110 and the second flexible base material 120 are bonded via the adhesive 130 provided between them.

At this time, the through holes 113 and 123 are opposed and conduct, the gold plate 140 is provided to the inner walls of these through holes 113 and 123 and is also extended on the reverse side to the through holes 113 and 123.

The first conductive pattern 111 and the second conductive pattern 121 conduct via this gold plate 140.

The conventional type flexible multilayer wiring board is manufactured by forming the first conductive pattern 111 on the first flexible base material 110 in a desired shape by etching, laminating the gold plate 112 on it by electrolytic plating and afterward, punching the through hole 113 by a press.

The second flexible base material 120 is also similarly manufactured by forming the second conductive pattern 121, the gold plate 122 and the through hole 123.

Afterward, the adhesive 130 is provided to at least one wiring board by desired means such as printing and both base materials are bonded.

Afterward, when the gold plate 140 is applied to the inner wall of the through holes 113 and 123 which mutually communicate by electrolytic plating and the like, and the first conductive pattern 111 and the second conductive pattern 121 conduct, the conventional type flexible multilayer wiring board is completed. As the first and second conductive patterns 111 and 121 are formed by etching, the gold plates 112 and 122 are respectively laminated on the first and second conductive patterns 111 and 121 by electrolytic plating and gold plating is also applied to the through holes 113 and 123, the conventional type flexible multilayer wiring board has a problem that the cost is increased because the processes are complex and in addition, gold plating is used.

As gold plate 140 is applied to the inner wall of the through holes 113 and 123, the reliability of the conduction of the first and second conductive patterns 111 and 121 may have a problem depending upon a state in which the gold plate adheres.

SUMMARY OF THE INVENTION

Then, the object of the invention is to provide a flexible multilayer wiring board of which the productivity is satisfactory, which is low-priced and highly reliable in connection.

For first solvable means for solving the above-mentioned problems, first and second flexible base materials of which each one surface is bonded via an adhesive and a first conductive body that electrically connects a first conductive pattern formed on the unbonded surface of the first flexible base material with a second conductive pattern formed on the second flexible base material are provided, the first flexible base material is provided with a first through hole and a connection which is formed around the first through hole on the side of the unbonded surface and which conducts with the first conductive pattern, space is provided between the periphery on the side of the bonded surface of the first through hole of the first flexible base material and the second flexible base material, an air path via which air in the space can escape is provided between the first and second flexible base materials, conductive paste forming the first conductive body is filled in the space via the first through hole, the connection and the second conductive pattern are electrically connected and when the conductive paste is filled in the space, air in the space escapes via the air path.

For second solvable means, the air path is formed by a part where the adhesive is not formed.

For third solvable means, an air port of the air path is provided at the peripheral end of at least one of the first flexible base material and the second flexible base material.

For fourth solvable means, the air port of the air path is provided to a mounting hole provided to mount the first and second flexible base materials.

For fifth solvable means, the second conductive pattern is formed on the side of the bonded surface of the second flexible base material and the first conductive body is touched to at least a part of the second conductive pattern.

For sixth solvable means, the second conductive pattern is formed on the side of the unbonded surface of the second flexible base material, a second through hole is provided in a position opposite to the first through hole in the second flexible base material, a second conductive body is filled in the second through hole, and the first and second conductive patterns conduct via the second conductive body.

For seventh solvable means, the first conductive body is formed by the screen printing of conductive paste.

For eighth solvable means, an insulating resist layer is respectively provided on the side of each bonded surface of the first and second flexible base materials and these resist layers are bonded via the adhesive.

DESCRIPTION OF THE PREFERRED EMBODIMENTS

Figure 1:
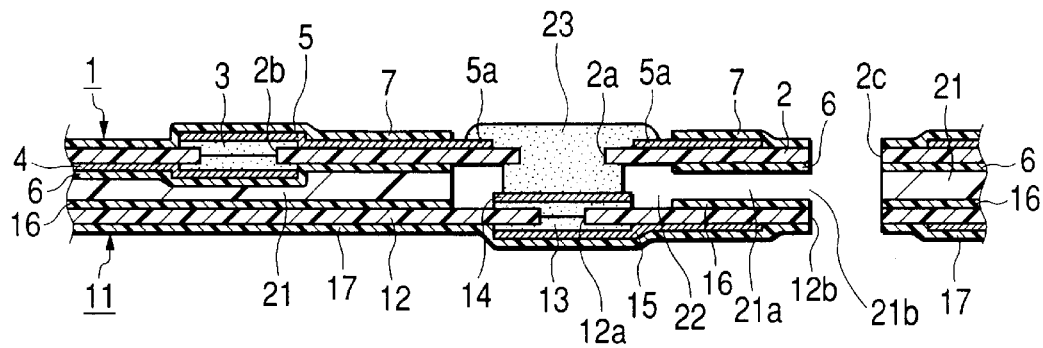
FIG. 1 is an enlarged sectional view showing the main part of a flexible multilayer wiring board according to the invention.
Figure 2:
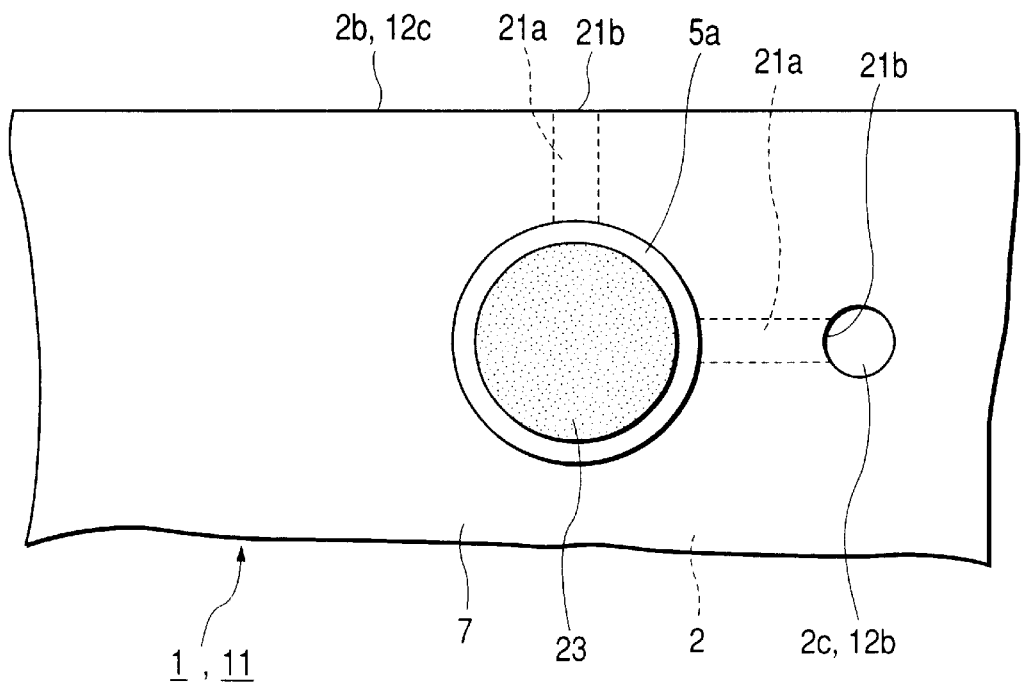
FIG. 2 is an enlarged plan showing the main part of the flexible multilayer wiring board according to the invention.
Figure 15:
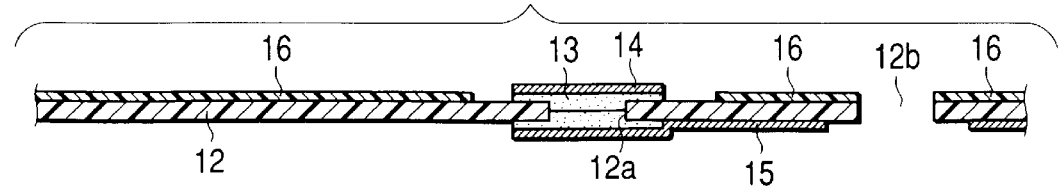
FIG. 15 is an explanatory drawing for explaining a sixth process for the manufacture of the second flexible wiring board of the flexible multilayer wiring board according to the invention.
Figure 16:
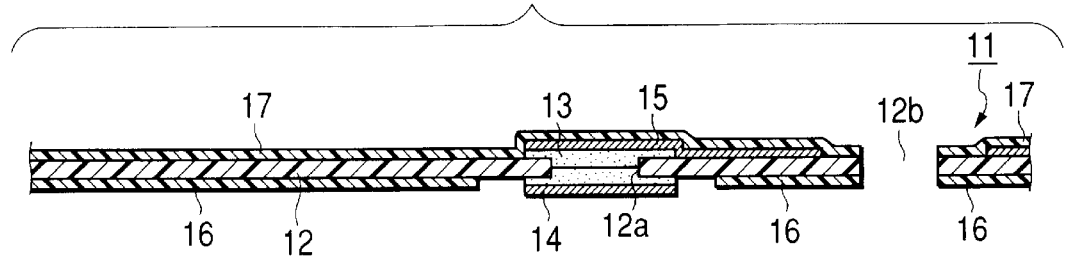
FIG. 16 is an explanatory drawing for explaining a seventh process for the manufacture of the second flexible wiring board of the flexible multilayer wiring board according to the invention.
Figure 17:
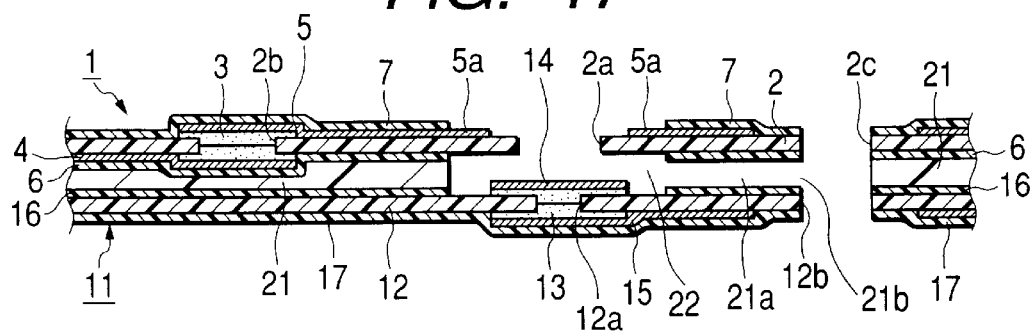
FIG. 17 is an explanatory drawing for explaining the manufacture of the flexible multilayer wiring board according to the invention.
Figure 18:
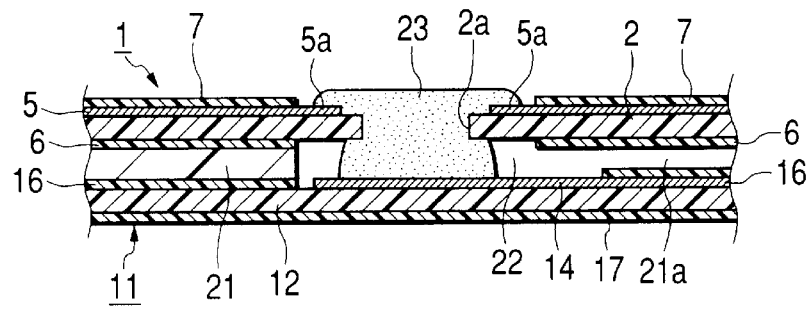
FIG. 18 is an enlarged sectional view showing the main part equivalent to another embodiment of the flexible multilayer wiring board according to the invention.
Figure 19:
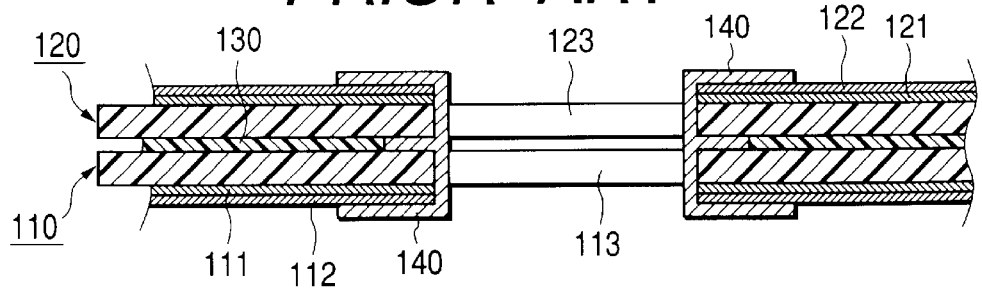
FIG. 19 is an enlarged sectional view showing the main part of a conventional type flexible multilayer wiring board.

To explain the drawings of a flexible multilayer wiring board according to the invention, FIG. 1 is an enlarged sectional view showing the main part of the flexible multilayer wiring board according to the invention, FIG. 2 is an enlarged plan showing the main part of the flexible multilayer wiring board according to the invention, FIGS. 3 to 9 are explanatory drawings for explaining the manufacture of a first flexible wiring board related to the flexible multilayer wiring board according to the invention, FIGS. 10 to 16 are explanatory drawings for explaining the manufacture of a second flexible wiring board related to the flexible multilayer wiring board according to the invention, FIG. 17 is an explanatory drawing for explaining the manufacture of the flexible multilayer wiring board according to the invention and FIG. 18 is an enlarged sectional view showing the main part of another embodiment of the flexible multilayer wiring board according to the invention.

Next, to explain the configuration of the flexible multilayer wiring board according to the invention referring to FIGS. 1 and 2, the flexible multilayer wiring board according to the invention is provided with the first flexible wiring board 1 and the second flexible wiring board 11.

First, to explain the configuration of the first flexible wiring board 1, a first flexible base material 2 is made of flexible flat substantially rectangular base material such as a polyester film and is provided with a relatively large circular through hole 2a which is a first through hole, a relatively small circular through hole 2b provided in a position apart from the through hole 2a and a mounting hole 2c provided in a position apart from the through hole 2a.

Conductive paste such as silver paste is filled in the through hole 2b of the first flexible base material 2, that is, a conductive body 3 formed by the screen printing of conductive paste is provided, a part of the conductive body 3 is extruded from the through hole 2b and is formed in the periphery of the through hole 2b.

Conductive patterns 4 and 5 are respectively formed on the lower surface which is the bonded surface and on the upper surface which is the unbonded surface respectively of the first flexible base material 2 by screen printing.

The conductive pattern 4 formed on the lower surface is formed across the conductive body 3, the conductive pattern 5 formed on the upper surface is also formed across the conductive body 3, one end of the conductive pattern 5 to be a first conductive pattern is extended to the vicinity of the through hole 2a and the conductive pattern 5 is provided with a connection 5a formed circularly so that it surrounds the through hole 2a.

As a result, the conductive patterns 4 and 5 respectively provided on the upper and lower surfaces of the first flexible base material 2 conduct via the conductive body 3.

Silver paste which is the material of the conductive patterns 4 and 5 is made by mixing binder resin and conductive filler in an organic solvent so that they become like ink (paste).

The conductive filler means a conductive particle and in this embodiment, silver power is used, however, another metallic powder or powder in which two or more types of powder are mixed (for example, powder acquired by mixing carbon power to an extent that conductivity is not impaired in silver powder) may also be used.

For binder resin in which conductive filler is dispersed, polyester resin and urethane resin are mainly used.

Resist layers 6 and 7 are respectively formed in a location except a part of the connection 5a on the lower surface which is the bonded surface and on the upper surface which is the unbonded surface respectively of the first flexible base material 2 and on the conductive patterns 4 and 5 by the screen printing of insulating paste.

These resist layers 6 and 7 are made of plastisol having thermoplastic resin such as vinyl chloride as a main component and for example, plastisol acquired by dispersing thermoplastic resin powder such as vinyl chloride resin in liquid plasticizer such as dioctyl phthalate (DOP) and further adding a stabilizer, thickener, pigment and others if necessary can be given.

The first flexible wiring board 1 is formed by such configuration.

Next, to explain the configuration of the second flexible wiring board 11, a second flexible base material 12 is made of flexible flat substantially rectangular base material such as a polyester film and is provided with a relatively small circular through hole 12a which is a second through hole and a mounting hole 12b provided in a position apart from the through hole 12a.

Conductive paste such as silver paste is filled in the through hole 12a of the second flexible base material 12, that is, a conductive body 13 which is a second conductive body formed by the screen printing of conductive paste is provided, a part of the conductive body 13 is extruded from the through hole 12a and is formed in the periphery of the through hole 12a.

Conductive patterns 14 and 15 to be a second conductive pattern are respectively formed on the upper surface which is the bonded surface and on the lower surface which is the unbonded surface respectively of the second flexible base material 12 by screen printing.

The conductive pattern 14 formed on the upper surface is formed across the conductive body 13 and the conductive pattern 15 formed on the lower surface is also formed across the conductive body 13.

As silver paste which is the material of the conductive patterns 14 and 15 is the same as that of the conductive patterns 4 and 5, the description is omitted.

Resist layers 16 and 17 are respectively formed on the upper surface which is the bonded surface and on the lower surface which is the unbonded surface respectively of the second flexible base material 12 and on the conductive patterns 14 and 15 by the screen printing of insulating paste.

At this time, a part of the conductive pattern 14 is exposed as shown in FIG. 1.

As these resist layers 16 and 17 are made of the same material as the material of the resist layers 6 and 7, the description is omitted.

The second flexible wiring board 11 is formed by such a configuration.

An insulating adhesive 21 is formed on at least one of the first and the second flexible wiring boards 1 and 11 configured as described above by printing and the first and second flexible wiring boards 1 and 11 are bonded via the adhesive 21.

That is, after the adhesive 21 is applied to the resist layer 6 of the first flexible wiring board 1 or the resist layer 16 of the second flexible wiring board 11, the through holes 2a and 12a of the first and second flexible wiring boards 1 and 11 are opposed, the mounting holes 2c and 12b of the first and second flexible wiring boards 1 and 11 are superimposed with the mounting holes opposite, the first and second flexible wiring boards 1 and 11 are bonded via the adhesive 21 and are integrated.

This adhesive 21 is made of plastisol which is a thermoplastic adhesive acquired by adding plasticizer, as well as a stabilizer and thickener if necessary, to the copolymer of vinyl chloride and vinyl acetate as a main component which is the main component of resist layers 6, 7, 16, 17.

This adhesive 21 is also made of a plastisol adhesive of which the bonding enabling temperature is lower than the thermally transformed temperature of the first and second flexible base materials 2 and 12.

For the copolymer of vinyl chloride and vinyl acetate, paste resin acquired by emulsifying and polymerizing the mixture of vinyl chloride and vinyl acetate using emulsifier and a water soluble polymerization initiator can be used.

For plasticizer, phthalic acid plasticizer such as DOP and fatty acid ester plasticizer such as adipic acid di(2-ethylhexyl) can be used.

For a stabilizer, an inorganic metallic compound such as white lead and basic silicon and an organic compound such as lauric acid and various metallic salt can be used.

As shown in FIGS. 1 and 2, when the first and second flexible wiring boards 1 and 11 are bonded, space 22 is formed in the vicinity of the through hole 2a between the first and second flexible base materials 2 and 12.

Inside the adhesive 21, a band part without the adhesive 21 (an air path) 21a is provided, connects the space 22 with the mounting holes 2c and 12b and connects the space 22 with the peripheral ends 2d and 12c of the first and second flexible base materials 2 and 12.

Air in the space 22 escapes outside from the peripheral ends 2d and 12c of the first and second flexible base materials 2 and 12 and the mounting holes 2c and 12b via the air path 21a and the termination of the air path 21a located at the peripheral ends 2d and 12c and the mounting holes 2c and 12b is an air port 21b.

The air path 21a may also be formed in either of the peripheral ends 2d and 12c or the mounting holes 2c and 12b.

It is described above that the air path 21a is formed by the part where the adhesive 21 is not formed, however, the air path may also be formed by providing a tape on the adhesive 21.

After the first and second flexible wiring boards 1 and 11 are bonded as described above, conductive paste such as silver paste is filled in the through hole 2a of the first flexible wiring board 1, that is, the conductive body 23 which is a large conductive body and which is formed by screen printing so that the conductive paste is overlapped with the connection 5a is provided.

When conductive paste forming the conductive body 23 is filled in the through hole 2a, it is filled with it sealing the through hole 2a, however, at this time, air in the space 22 is pressed by the conductive paste and escapes outside from the air port 21b via the air path 21a.

Therefore, the conductive paste smoothly flows into the space 22 and securely flows onto the conductive pattern 14.

When the conductive body 23 is formed, it securely comes in contact with the connection 5a of the conductive pattern 5 located on the side of the unbonded surface of the first flexible base material 2 and the conductive pattern 14 located on the side of the bonded surface of the second flexible base material 12 and the conductive patterns 5 and 14 conduct.

Figure 3:
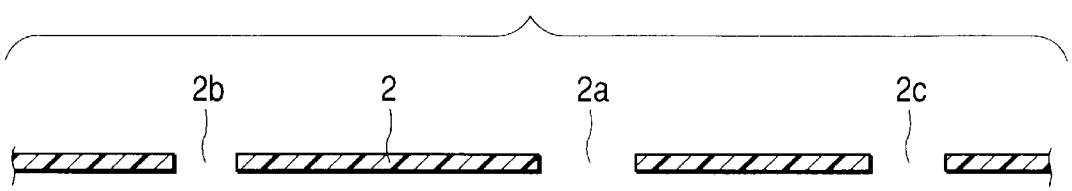
FIG. 3 is an explanatory drawing for explaining a first process for the manufacture of a first flexible wiring board of the flexible multilayer wiring board according to the invention.

Next, to explain a manufacturing process of the flexible multilayer wiring board according to the invention referring to FIGS. 3 to 17, FIGS. 3 to 9 show a manufacturing process of the first flexible wiring board 1. First, to explain the manufacturing process of the first flexible wiring board 1, the first flexible base material 2 is punched for a first process as shown in FIG. 3, and the through holes 2a and 2b and the mounting hole 2c are simultaneously formed.

Figure 4:
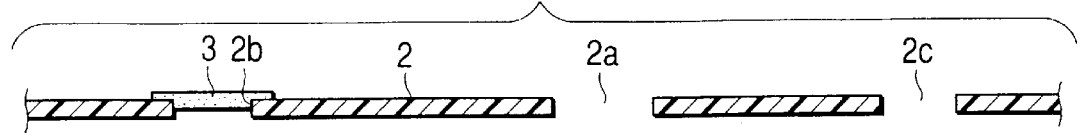
FIG. 4 is an explanatory drawing for explaining a second process for the manufacture of the first flexible wiring board of the flexible multilayer wiring board according to the invention.

Next, for a second process, as shown in FIG. 4, after conductive paste is filled in the through hole 2b from the side of the unbonded surface of the first flexible base material 2 by screen printing, the conductive paste is dried and the upper conductive body 3 is formed.

Figure 5:
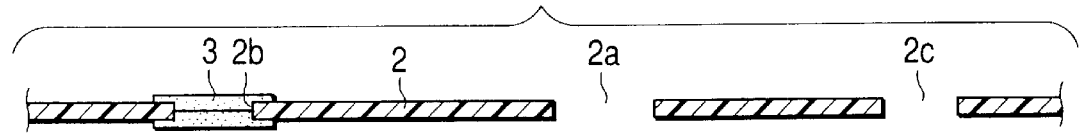
FIG. 5 is an explanatory drawing for explaining a third process for the manufacture of the first flexible wiring board of the flexible multilayer wiring board according to the invention.

Next, for a third process, as shown in FIG. 5, after the first flexible base material 2 is turned back and conductive paste is filled in the through hole 2b from the side of the bonded surface by screen printing, the formation of the conductive body 3 is completed by drying the conductive paste and forming the lower conductive body 3.

Figure 6:
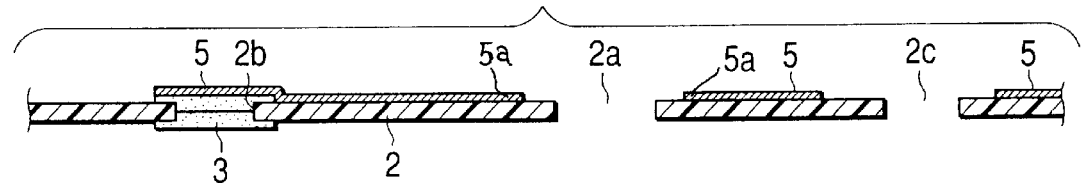
FIG. 6 is an explanatory drawing for explaining a fourth process for the manufacture of the first flexible wiring board of the flexible multilayer wiring board according to the invention.

Next, for a fourth process, as shown in FIG. 6, the conductive pattern 5 and the connection 5a are formed by screen-printing and baking conductive paste from the side of the unbonded surface of the first flexible base material 2.

At this time, the connection 5a printed in the vicinity of the through hole 2a is formed at a slight interval from the through hole 2a so that conductive paste does not spill from the through hole 2a.

Figure 7:
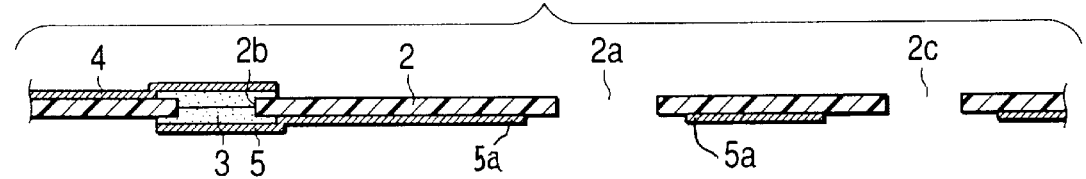
FIG. 7 is an explanatory drawing for explaining a fifth process for the manufacture of a first flexible wiring board of the flexible multilayer wiring board according to the invention.

Next, for a fifth process, as shown in FIG. 7, the conductive pattern 4 is formed by turning back the first flexible base material 2, screen-printing and baking conductive paste from the side of the bonded surface.

Figure 8:
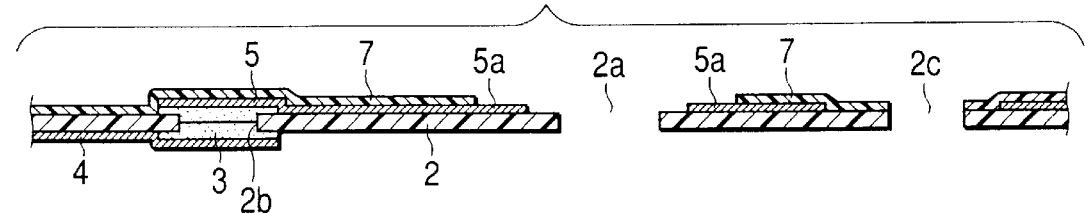
FIG. 8 is an explanatory drawing for explaining a sixth process for the manufacture of the first flexible wiring board of the flexible multilayer wiring board according to the invention.

Next, for a sixth process, as shown in FIG. 8, the resist layer 7 is formed by screen-printing and drying insulating paste from the side of the unbonded surface of the first flexible base material 2.

At this time, the connection 5a provided in the vicinity of the through hole 2a is exposed.

Figure 9:
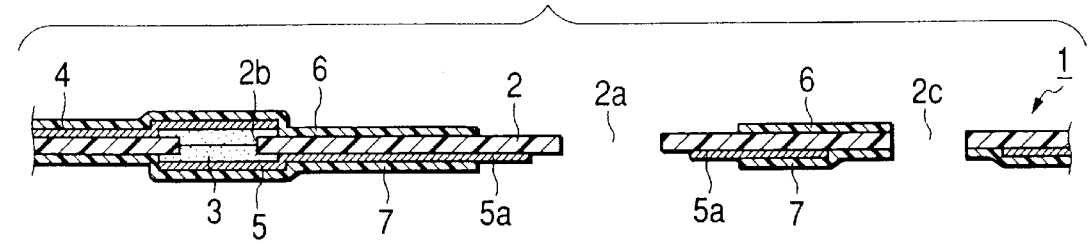
FIG. 9 is an explanatory drawing for explaining a seventh process for the manufacture of the first flexible wiring board of the flexible multilayer wiring board according to the invention.

Next, for a seventh process, as shown in FIG. 9, the resist layer 6 is formed by turning back the first flexible base material 2, screen-printing and drying insulating paste from the side of the bonded surface.

The first flexible wiring board 1 is manufactured as described above.

Figure 10:
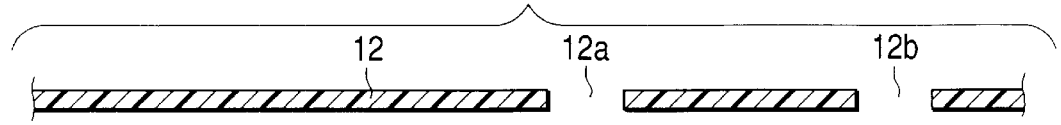
FIG. 10 is an explanatory drawing for explaining a first process for the manufacture of a second flexible wiring board of the flexible multilayer wiring board according to the invention.

Next, to explain a manufacturing process of the second flexible wiring board 11 referring to FIGS. 10 to 16, the second flexible base material 12 is punched, and the through hole 12a and the mounting hole 12b are simultaneously formed for a first process as shown in FIG. 10.

Figure 11:
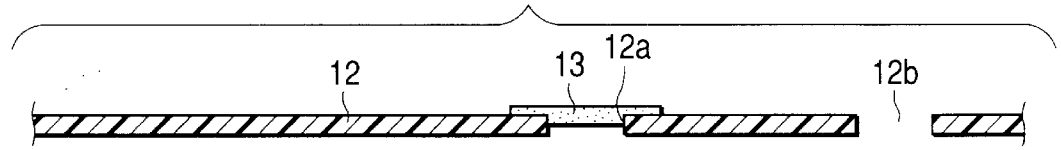
FIG. 11 is an explanatory drawing for explaining a second process for the manufacture of the second flexible wiring board of the flexible multilayer wiring board according to the invention.

Next, for a second process, as shown in FIG. 11, after conductive paste is filled in the through hole 12a from the side of the bonded surface of the second flexible base material 12 by screen printing, the conductive paste is dried and the upper conductive body 13 is formed.

Figure 12:
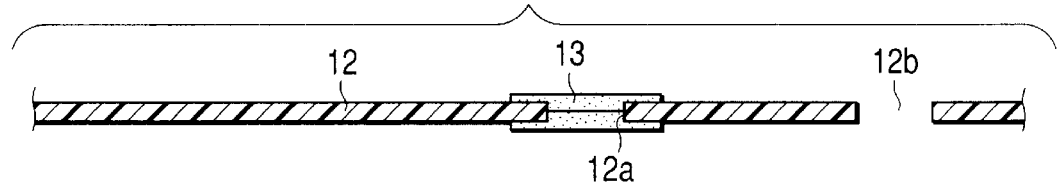
FIG. 12 is an explanatory drawing for explaining a third process for the manufacture of the second flexible wiring board of the flexible multilayer wiring board according to the invention.

Next, for a third process, as shown in FIG. 12, after the second flexible base material 12 is turned back and conductive paste is filled in the through hole 12a from the side of the unbonded surface by screen printing, the formation of the conductive body 13 is completed by drying the conductive paste and forming the lower conductive body 13.

Figure 13:
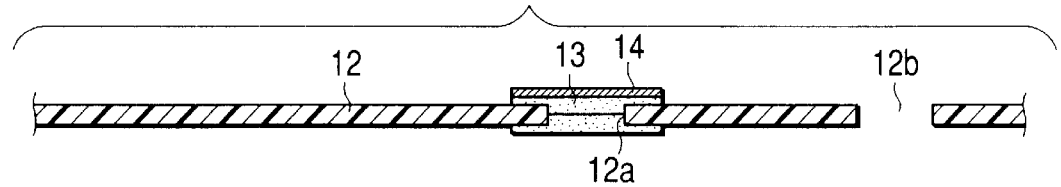
FIG. 13 is an explanatory drawing for explaining a fourth process for the manufacture of the second flexible wiring board of the flexible multilayer wiring board according to the invention.

Next, for a fourth process, as shown in FIG. 13, the conductive pattern 14 is formed by screen-printing and baking conductive paste from the side of the bonded surface of the second flexible base material 12.

Figure 14:
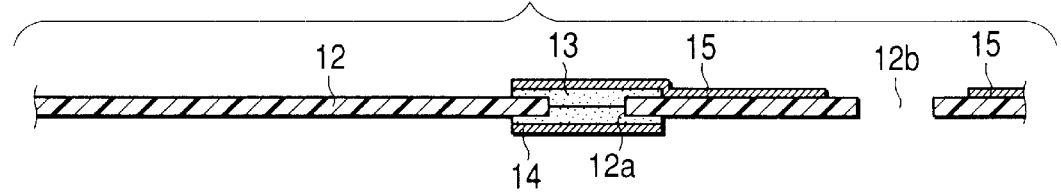
FIG. 14 is an explanatory drawing for explaining a fifth process for the manufacture of the second flexible wiring board of the flexible multilayer wiring board according to the invention.

Next, for a fifth process, as shown in FIG. 14, the conductive pattern 15 is formed by turning back the second flexible base material 12, screen-printing and baking conductive paste from the side of the unbonded surface.

Next, for a sixth process, as shown in FIG. 15, the resist layer 16 is formed by screen-printing and drying insulating paste from the side of the bonded surface of the second flexible base material 12.

At this time, the conductive pattern 14 provided on the through hole 12a is exposed.

Next, for a seventh process, as shown in FIG. 16, the resist layer 17 is formed by turning back the second flexible base material 12 and screen-printing and drying insulating paste from the side of the unbonded surface.

The second flexible wiring board 11 is manufactured as described above.

The adhesive 21 is formed on at least one of the first and the second flexible wiring boards 1 and 11 configured as described above by printing, as shown in FIG. 17, the through holes 2a and 12a of the first and second flexible wiring boards 1 and 11 are opposed, both the first and second flexible wiring boards are superimposed with the mounting holes 2c and 12b of the first and second flexible wiring boards 1 and 11 opposite, the first and second flexible wiring boards 1 and 11 are bonded via the adhesive 21 and are integrated.

Afterward, when conductive paste is filled from the through hole 2a of the first flexible wiring board 1 by screen printing so that the conductive paste is overlapped with the connection 5a, is dried and the conductive body 23 is formed, then the connection 5a of the conductive pattern 5 located on the side of the unbonded surface of the first flexible base material 2 and the conductive pattern 14 located on the side of the bonded surface of the second flexible base material 12 conduct via the conductive body 23 as shown in FIG. 1.

When the conductive paste forming the conductive body 23 is filled in the through hole 2a, it is filled with it sealing the through hole 2a, however, at this time, air in the space 22 is pressed by the conductive paste and escapes outside from the air port 21b via the air path 21a.

The flexible multilayer wiring board according to the invention is manufactured by the above-mentioned process.

In this embodiment, a part of the conductive pattern 14 formed on the side of the bonded surface is arranged on the conductive body 13, however, a conductive body in a state in which the conductive body is not connected to the conductive pattern 14 may also be arranged, the conductive body and a part of the conductive pattern 14 are removed from on the conductive body 13, and the conductive body 13 and the conductive body 23 may also be made to directly conduct.

FIG. 18 shows another embodiment of the flexible multilayer wiring board according to the invention and in this embodiment, the through hole 12a and the conductive body 13 in the above-mentioned embodiment are removed, and a conductive body 23 and a conductive pattern 14 formed on the side of a bonded surface are made to conduct.

As the other configuration is the similar to that in the above-mentioned embodiment, the same number is allocated to the same component and the description is omitted.

In the flexible multilayer wiring board according to the invention, as the first conductive pattern 5 provided to the first flexible base material 2 and the second conductive pattern provided to the second flexible base material 12 conduct via the first conductive body 23 filled in the first through hole 2a, the flexible multilayer wiring board can be provided of which the productivity is satisfactory, which is low-priced and highly reliable in connection compared with that of a conventional type flexible multilayer wiring board in which gold plate is applied.

Also, as the space 22 is provided between the periphery on the side of the bonded surface of the first through hole 2a of the first flexible base material 2 and the second flexible base material 12, the air path 21a via which air in the space can escape is provided between the first and second flexible base materials 2 and 12, and further, when conductive paste is filled in the space 22, air in the space 22 escapes via the air path 21a, the air pressed by the conductive paste escapes outside from the air port 21b via the air path 21a, and therefore, the conductive paste smoothly flows into the space 22, the conductive paste securely flows onto the conductive pattern 14, and the first and second conductive patterns securely conduct.

Also, as the air path 21a is formed by the part where the adhesive 21 is not formed, the air path 21a can be easily formed.

Also, as the air port 21b of the air path 21a is provided to the peripheral end of the first flexible base material 2 or/and the second flexible base material 12 or/and the mounting holes 2c and 12b provided to mount the first and second flexible base materials 2 and 12, a hole is not required to be separately formed for the air port 21b and the simple configuration is acquired.

Also, as the second conductive pattern 14 is formed on the side of the bonded surface of the second flexible base material 12 and the first conductive body 23 is touched to a part of the second conductive pattern 14, the reliability of electric connection between the first and second conductive patterns 5 and 14 can be enhanced.

Also, if the second conductive pattern 14 is a pattern for wiring, a higher-density pattern can be formed and the multilayer wiring board suitably usable for a multilayer wiring board is acquired.

Also, as the second conductive pattern 15 is formed on the side of the unbonded surface of the second flexible base material 12, the second through hole 12a is provided in a position opposite to the first through hole 2a in the second flexible base material 12, the second conductive body 12 is filled in the second through hole 12a and the first and second conductive patterns 5 and 15 conduct via the second conductive body 13, a higher-density pattern can be formed and the multilayer wiring board suitably usable for a multilayer wiring board is acquired.

Also, as the first conductive body 23 is formed by the screen printing of conductive paste, the first conductive body 23 can be formed by one process of screen printing even if many through holes are provided and the multilayer wiring board of which the productivity is satisfactory is acquired.

Also, as the resist layers 6 and 16 are respectively provided to the side of each bonded surface of the first and second flexible base materials 2 and 12 and are bonded via the adhesive 21, three layers of the resist layers 6 and 16 and the adhesive 21 exist between the first and second conductive patterns 4 and 14 even if the first and second conductive patterns 4 and 14 respectively formed on the bonded surface of the respective base materials are opposite and therefore, insulation resistance between both can be enhanced.

What is claimed is:

1. A flexible multilayer wiring board, comprising:

first and second flexible base materials, each having a bonded surface bonded with an adhesive and an unbonded surface; and a first conductive body that electrically connects a first conductive pattern formed on the unbonded surface of the first flexible base material and a second conductive pattern formed on the second flexible base material, wherein:

the first flexible base material is provided with a first through hole and the first conductive body is provided in the first through hole;

space is provided between the bonded surface of the first flexible base material and the bonded surface of the second flexible base material in the periphery of the first through hole;

a conductive paste forming the first conductive body is filled in the space through the first through hole;

an air path via which air in the space can escape is provide between the first and second flexible base materials, wherein no adhesive is formed in said air path.

2. A flexible multilayer wiring board according to claim 1, wherein an air port of the air path is provided at the peripheral end of at least one of the first flexible base material and the second flexible base material.

3. A flexible multilayer wiring board according to claim 1, wherein an air port of the air path is provided to a mounting hole provided to mount the first and second flexible base materials.

4. A flexible multilayer wiring board according to claim 1, wherein:

the second conductive pattern is formed on the side of the bonded surface of the second flexible base material; and the first conductive body is touched to at least a part of the second conductive pattern.

5. A flexible multilayer wiring board according to claim 1, wherein:

the second conductive pattern is formed on the side of the unbonded surface of the second flexible base material;

a second through hole is provided in a position opposite to the first through hole in the second flexible base material;

a second conductive body is filled in the second through hole; and the first and second conductive patterns conduct via the second conductive body.

6. A flexible multilayer wiring board according to claim 1, wherein the first conductive body is formed by the screen printing of conductive paste.

7. A flexible multilayer wiring board according to claim 1, wherein:

insulating resist layers are respectively provided on the side of the bonded surface of the first and second flexible base materials; and these resist layers are bonded via the adhesive.

* * * * *